United States Patent [19]

Harder et al.

[11] Patent Number: 5,060,233
[45] Date of Patent: Oct. 22, 1991

[54] MINIATURE BLUE-GREEN LASER SOURCE USING SECOND-HARMONIC GENERATION

[75] Inventors: Christoph S. Harder, Zurich, Switzerland; Wilfried Lenth, Capitola, Calif.; Heinz P. Meier, Thalwil, Switzerland; William P. Risk, Mountain View, Calif.

[73] Assignee: International Business Machines Corporation, Armonk, N.Y.

[21] Appl. No.: 570,251

[22] Filed: Aug. 17, 1990

Related U.S. Application Data

[63] Continuation-in-part of Ser. No. 297,461, Jan. 13, 1989, abandoned.

[51] Int. Cl.$^5$ ................................................ H01S 3/10
[52] U.S. Cl. ........................................ 372/22; 372/75; 359/328
[58] Field of Search ............................ 372/21, 22, 75; 307/427, 425; 369/110, 121, 122

[56] References Cited

U.S. PATENT DOCUMENTS

| | | | |
|---|---|---|---|
| 4,449,204 | 5/1984 | Shimada et al. | 369/110 |
| 4,618,957 | 10/1986 | Liu | 372/22 |
| 4,791,631 | 12/1988 | Baumert et al. | 372/22 |
| 4,856,006 | 8/1989 | Yano et al. | 372/22 |
| 4,879,722 | 11/1989 | Dixon et al. | 372/21 |
| 4,884,276 | 11/1989 | Dixon et al. | 372/21 |
| 4,884,281 | 11/1989 | Hawthorn et al. | 372/75 |
| 4,896,931 | 1/1990 | Khurgin | 307/427 |
| 4,910,740 | 3/1990 | Oka | 372/22 |
| 4,953,166 | 8/1990 | Mooradian | 372/21 |

OTHER PUBLICATIONS

Feketa et al., "Graded Index Separate Confinement InGaAs/GaAs Strained Layer Quantum Well Laser" Applied Physics Letter, 44, Apr. 1, 1984.

Taniuchi, T. et al., "Miniaturized Light Source of Coherent Blue Radiation" CLE087, p. 198.
Baumert, J. C. et al., "High-Efficiency Intracavity Frequency Doubling of a Styryl-9 Dye Laser with KNbO$_3$ Crystals," Applied Optics, vol. 24, No. 9, (May 1, 1985), pp. 1299-1301.
Melchoir, M. et al., "Frequency Stabilization of Semiconductor Lasers for Applications in Coherent Communication Systems" Journal of Lightwave Technology, vol. LT-5, No. 4 (Apr. 1987), pp. 485-491.
Kozlovsky, W. et al., "Efficient Second Harmonic Generation of a Diode Laser-Pumped CW Nd:Yag Laser Using Monolithic MgO:LiNbO$_3$ External Resonant Cavities" IEEE Journal of Quantum Electronics, vol. 24, No. 6 (Jun. 1988), pp. 913-919.

Primary Examiner—William L. Sikes
Assistant Examiner—Susan S. Morse
Attorney, Agent, or Firm—Douglas R. Millett

[57] ABSTRACT

Apparatus and method for producing coherent blue-green-light radiation having a wavelength of essentially 490-500 nm. A diode laser, such as a strained-layer InGaAs/GaAs diode laser, provides a 980-1,000 nm beam, and a nonlinear crystal of KTP produces coherent radiation by noncritically phase-matched second-harmonic generation (SHG) of said beam. The beam preferably has a wavelength of essentially 994 nm for generating radiation having a wavelength of essentially 497 nm. The crystal is disposed within an optical resonator and the frequency of the laser is locked to that of the resonator. Alternatively, two diode lasers are oriented to provide orthogonally polarized beams each with a wavelength of 980-1,000 nm but within essentially 1 nm of each other, and the KTP crystal is oriented with its a- and c-axis parallel to the orthogonally polarized beams. The KTP crystal may have an associated optical waveguide along which the beam is propagated to enhance SHG efficiency.

32 Claims, 4 Drawing Sheets

MINIATURE BLUE-GREEN LASER SOURCE USING SECOND-HARMONIC GENERATION

This is a continuation-in-part of application Ser. No. 07/297,461, now abandoned filed Jan. 13, 1989.

BACKGROUND OF THE INVENTION

1. Field of the Invention

This invention relates to a laser source and method for producing coherent blue-green-light radiation, and more particularly relates to a miniature solid-state laser source and method for producing said radiation by second-harmonic generation of the output of a semiconductor diode laser in a nonlinear crystal that permits noncritical phase matching over a wide range of temperatures, angles and input wavelength, rendering it especially suitable for optical storage applications.

2. Description of the Prior Art

Blue-green lasers are desirable because they permit a significant enhancement of the storage density of an optical recording system. However, fundamental material fabrication problems are encountered in developing diode lasers operating at wavelengths <600 nm (i.e., in the blue-green range).

Insofar as we are aware, there are only two reported examples of direct frequency doubling of diode laser radiation by second-harmonic generation (SHG). T. Taniuchi et al. reported in CLEO 87, Paper WP6, discloses generation of essentially 420 nm radiation by SHG of a GaAlAs diode laser using a $LiNbO_3$ waveguide. However, this material does not permit phase-matched SHG at 420 nm, and the blue-green light has a curved wavefront that cannot be focussed to a diffraction-limited spot and hence is unsuitable for optical storage and many other uses. Also, $LiNbO_3$ has a relatively low optical damage threshold due to photorefractive processes.

J. C. Baumert et al, in APPLIED OPTICS, Volume 24, page 1299 (1985) reported that frequency doubling of 860 nm GaAlAs diode lasers can be achieved with $KNbO_3$ at room temperature; but this material has many disadvantages that severely limit its suitability for practical devices. For example, $KNbO_3$ is difficult to grow and undergoes two phase transitions between the growth temperature and room temperature. Also the temperature and wavelength tolerances for phase matching are extremely narrow, and therefore would require a laser of very specific wavelength and also precise temperature stabilization of the SHG crystal.

Other related approaches use diode-laser pumped Nd:YAG lasers to generate 530 nm radiation by phase-matched SHG since suitable nonlinear materials are available for this process. Similarly, frequency mixing of an 808 nm diode laser and a 1.06 μm Nd:YAG laser is possible in the commercially available nonlinear material $KTiOPO_4$ (KTP), as disclosed in U.S. Pat. No. 4,791,631, issued Dec. 13, 1988, assigned to the assignee of the present invention.

There is a need for a practical nonlinear material which can be cut for noncritically phase-matched SHG of the shortest wavelength possible and combined with a semiconductor diode laser that operates at the phase-matching wavelength. Insofar as applicants are aware, coherent radiation has never heretofore been provided by SHG of a diode laser in a nonlinear crystal consisting essentially of KTP.

SUMMARY OF THE INVENTION

Toward this end and according to the invention, a miniature blue-green laser source has been developed that has two key components: (a) a semiconductor diode laser recently developed by others and having a wavelength of essentially 980–1,000 nm; and (b) a crystal of KTP that applicants unexpectedly found to permit noncritical type II phase-matched SHG of essentially 980–1,000 nm radiation over a wide range of temperatures, input wavelengths and angles of the input beam to the crystal.

The apparatus and method embodying the invention produce coherent blue-green-light radiation having a wavelength of essentially 490–500 nm. A diode laser, such as a strained-layer InGaAs/GaAs, semiconductor laser, provides an essentially 980–1000 nm beam, and a nonlinear crystal of essentially KTP produces the blue-green radiation by noncritically phase-matched SHG of said beam. The beam preferably has a wavelength of 994 nm for generating 497 nm radiation. Also the frequency of the laser is preferably matched and locked to that of an optical resonator within which the crystal is disposed.

DESCRIPTION OF PREFERRED EMBODIMENTS

Figure 1:
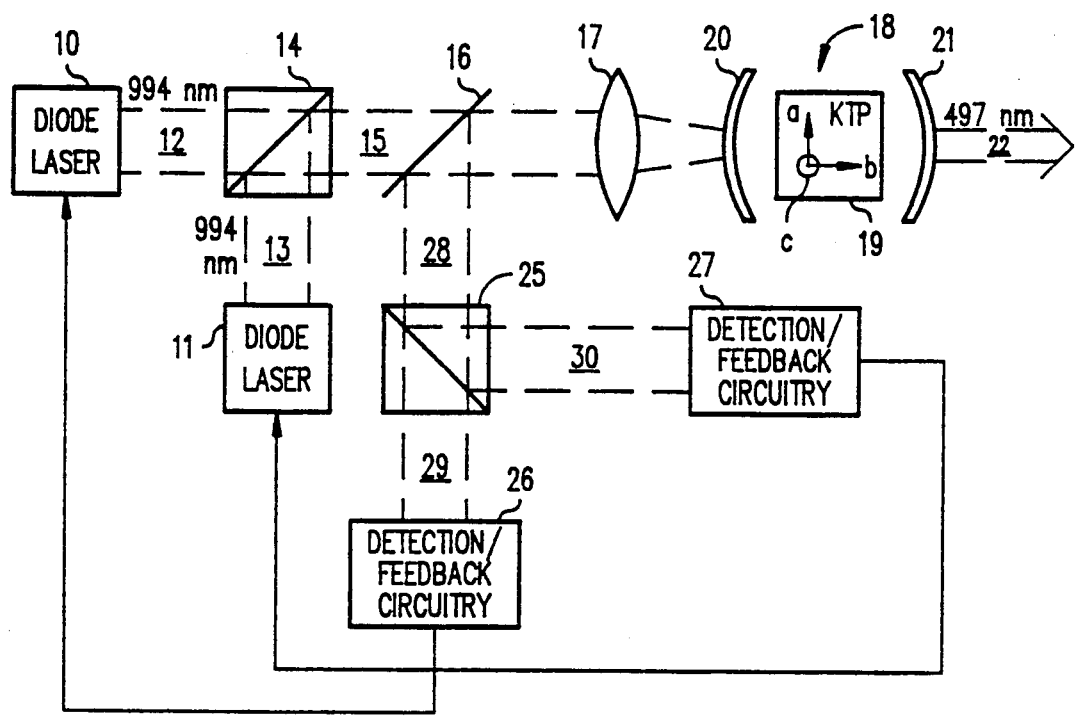
FIG. 1 is a schematic diagram of a resonator-enhanced apparatus for generating blue-green light, according to one embodiment of the invention.

As illustrated in FIG. 1, the apparatus embodying the invention comprises two strained-layer InGaAs/GaAs diode lasers 10, 11 with collimation optics and output beams 12, 13, respectively, that each provide essentially 994 nm fundamental radiation. For a detailed discussion of these types of lasers see "Graded-Index Separate-Confinement InGaAs/GaAs Strained-Layer Quantum Well Laser" by D. Feketa, et al., Applied Physics Letter 49, 15 Dec. 1986 and "Strained-Layer Quatum-Well Injection Laser" by W. D. Laidig, et al., Applied Physics Letter 44, 1 Apr. 1984.

Beams 12 and 13 may be modulated, i.e. the lasers 10 and 11 may be turned on and off, for data storage applications. Optional Faraday Isolators may be used at the output of lasers 10, 11 to minimize optical feedback to the lasers. Beams 12, 13 are orthogonally polarized and directed to a conventionally coated polarization beam splitter 14. Beam splitter 14 combines the 994 nm beams 12, 13 into a beam 15 that is directed to a standard beam splitter 16. Beam splitter 16 passes the 994 nm fundamental radiation via a focussing lens 17 to a passive Fabry-Perot resonator 18. Resonator 18 is resonant at a wavelength of 994 nm. It may be formed by placing a crystal 19 consisting of essentially KTP between two mirrors 20, 21 which are highly reflective at 994 nm; or, if preferred, resonator 18 may be formed by polishing spherical and/or flat surfaces at opposite ends of the crystal and depositing highly reflective coatings thereon. Mirrors 20, 21 have facing surfaces that reflect the 994 nm; and mirror 21 transmits the 497 nm radiation.

The birefringence of KTP crystal 19 causes the resonator 18 to have two sets of resonant modes. Laser diode 10 is linearly polarized along the a-axis of the KTP crystal and is frequency locked, in the manner hereafter described, to the a-axis polarized resonance of the resonator. Laser diode 11 is polarized along the c-axis of the crystal and is similarly frequency locked to the c-axis polarized resonator resonance. The beam 15 of essentially 994 nm radiation is focussed by lens 17 into, and is propagated along the b-axis of, KTP crystal 19, thereby producing a beam 22 of coherent blue-green-light radiation at essentially 497 nm by Type II noncritically phase-matched SHG of beam 15. The frequencies of these two resonances may not be identical; however, as long as they are within the 1.4 nm wide phase-matching bandwidth for SHG, beam 22 will be efficiently produced. The a-, b- and c-axis of a crystal such as KTP are well known in the art. For example, see "Electro-Optic and Dielectric Properties of KTiOPO$_4$" Applied Physics Letter, Vol. 49, No. 15, p. 917, (Oct. 13, 1986) by Bierlein and Arweiler.

The diode lasers 10, 11 are frequency locked to the resonances of the resonator 18 by respective feedback loops that comprise a polarization beam splitter 25 and two detection and feedback circuits 26, 27. Beam splitter 16 directs a beam 28 of 994 nm radiation to beam splitter 25 which then splits said beam into an a-axis polarized beam 29 and a c-axis polarized beam 30. Beam 29 is directed to detection/feedback circuit 26 which may, for sake of illustration, be of the type disclosed in the April 1987 issue of "IEEE Journal of Lightwave Technology" at pp. 485 et seq. This circuit 26 comprises briefly means (not shown) for generating a signal indicative of deviations in the frequency of the beam 12 from the frequency of the resonator 18 and for adjusting the injection current to diode laser 10 and/or its temperature to maintain the laser frequency at the resonator frequency. Beam 30 is directed to detection/feedback circuit 27 which comprises similar means (not shown) to adjust the injection current to diode laser 11 and/or its temperature.

Figure 2:
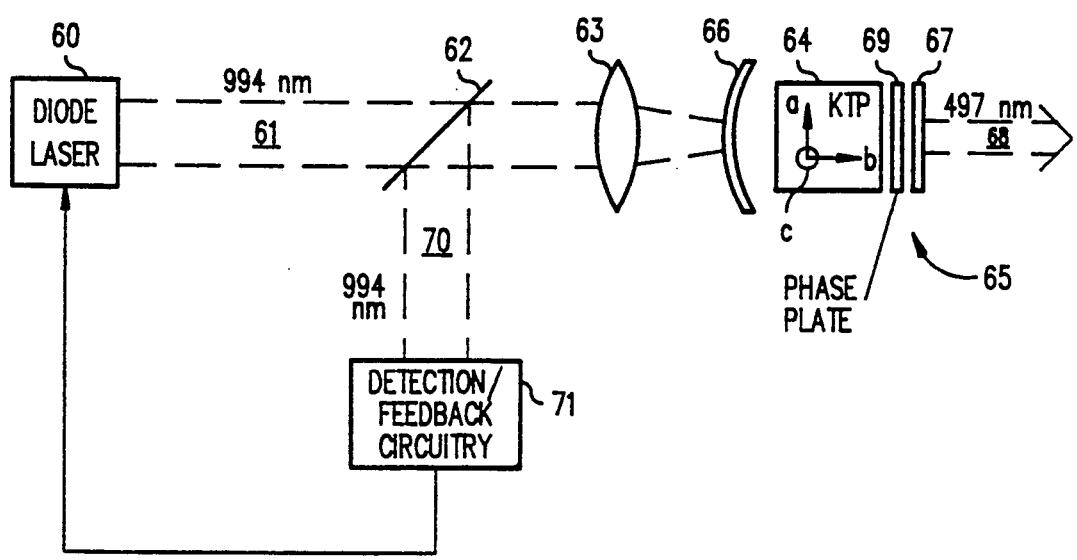
FIG. 2 is a schematic diagram of such an apparatus according to another embodiment of the invention.

As illustrated in FIG. 2, the apparatus embodying the invention comprises a single strained-layer InGaAs/GaAs diode laser 60 with collimation optics and output beam 61 to provide essentially 994 nm fundamental radiation of linear polarization. An opional Faraday Isolator may be used at the output of laser 60 to minimize optical feedback. Beam 61 may be modulated, i.e. the laser 60 may be turned on and off, for data storage applications. Crystal 64 of essentially KTP is part of a passive resonator 65. Mirrors 66, 67 at opposite ends of crystal 64 are highly reflective at 994 nm. Mirror 67 is highly transmissive at 497 nm. The nonlinear crystal 64 is oriented such that its a- and c-axis are at an angle of 45 degrees to the polarization of the essentially 994 nm beam 61 for Type II noncritically phase matched second harmonic generation. In effect, beam 61 has a first and a second orthogonal polarization components parallel to the a- and c-axis, respectively. The phase plate 69 is oriented such that it corrects the polarization of the 994 nm radiation emerging from the crystal 64 so that the 994 nm radiation has a polarization direction of 45 degrees with respect to the a- and c-axis of the KTP crystal 64 when it re-enters the crystal after a round-trip pass through the resonator. Phase plate 69 ensures that there will be a common resonance frequency for both a- and c-axis polarization components. This is the resonance frequency of resonator 65. The diode laser 60 is frequency locked to the resonance of the resonator 65 by a feedback loop which comprises a beam splitter 62 and the detection and feedback circuitry 71. The feedback circuitry 71, as described in connection with the embodiment of FIG. 1, adjusts the injection current to diode laser 60 and/or its temperature.

Figure 3:
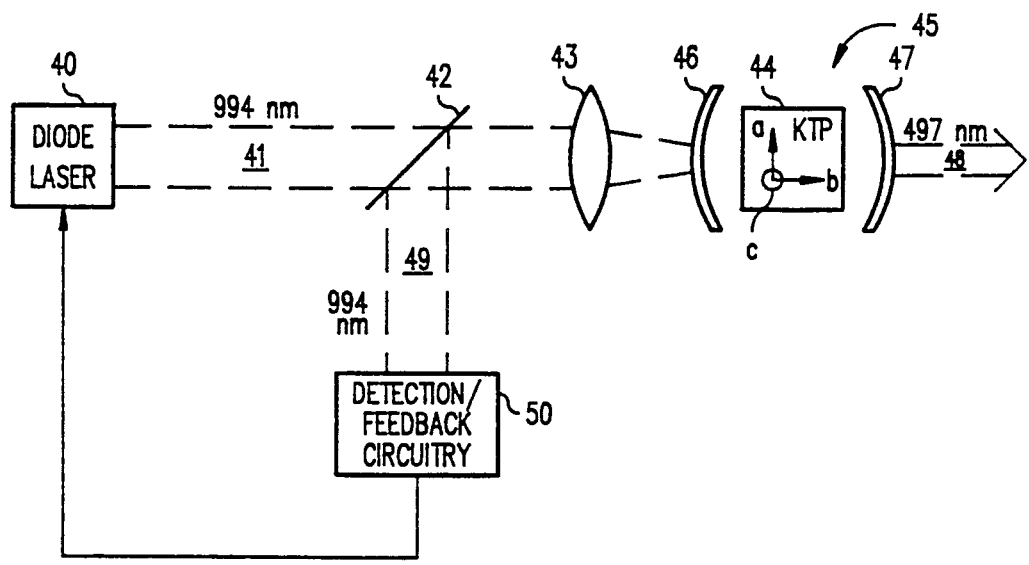
FIG. 3 is a schematic diagram of a resonator-enhanced apparatus for generating blue-green light, according to a modified embodiment.

As illustrated in FIG. 3, the apparatus embodying the invention comprises a single strained-layer InGaAs/GaAs diode laser 40 with collimation optics and output beam 41 to provide essentially 994 nm fundamental radiation. An optional Faraday Isolator may be used at the output of laser 40 to minimize optional feedback. Beam 41 may be modulated, i.e. the laser 40 may be turned on and off, for data storage applications. Beam 41 is directed through a dichroic beam splitter 42 and a focussing lens 43 into a crystal 44 of essentially KTP that forms part of a passive resonator 45. Mirrors 46, 47 (or highly reflective coatings) at opposite ends of crystal 44 are highly reflective at 497 nm; but mirror 47 has a residual small transmission at 497 nm adjusted for maximum blue-green output power for the characteristics of the particular KTP crystal used.

Beam 41 is polarized at 45° to the a- and c-axis of the crystal 44. In effect, beam 41 has a first and a second orthogonal polarization components parallel to the a- and c-axis, respectively. Resonator 45 is designed to be resonant at the second-harmonic wavelength of essentially 497 nm. Since the second-harmonic radiation is linearly polarized along the a-axis of crystal 44 (i.e., there is no c-axis polarization component), the second-harmonic radiation generated within the crystal can excite a similar a-axis polarized resonant mode of resonator 45. Thus, a beam 48 of coherent blue-green-light radiation at essentially 497 nm is produced by noncritically Type II phased-matched SHG of beam 41 as focussed by lens 43.

The wavelength of the generated second-harmonic radiation can be controlled by tuning the fundamental diode laser wavelength so that the essentially 497 nm radiation generated is frequency locked to match the resonant wavelength of resonator 45 by directing beam 49 to detection/feedback circuitry 50 which, as in the earlier described embodiment, adjusts the injection current to diode laser 40 and/or its temperature.

It should be noted that the efficiency obtained with the configuration of FIGS. 1 and 2 are essentially equivalent to the square of the finesse of their passive resonators 18, 65, respectively. The efficiency enhancement for the FIG. 3 configuration is essentially equal to the finesse of its resonator 45. The efficiency enhancement is thus less for the FIG. 3 configuration, but that configuration is simpler than that of FIG. 1 wherein only one diode laser needs to be frequency locked to a resonant mode of the resonator.

The resonator 18 or 45 may, if desired, be replaced by a ring resonator comprising three or more reflecting surfaces. These surfaces may be provided by external mirrors or by polished crystal surfaces, such as described in the June 1988 issue of the "IEEE Journal of Quantum Electronics" at pp. 913 et seq.

Figure 4:
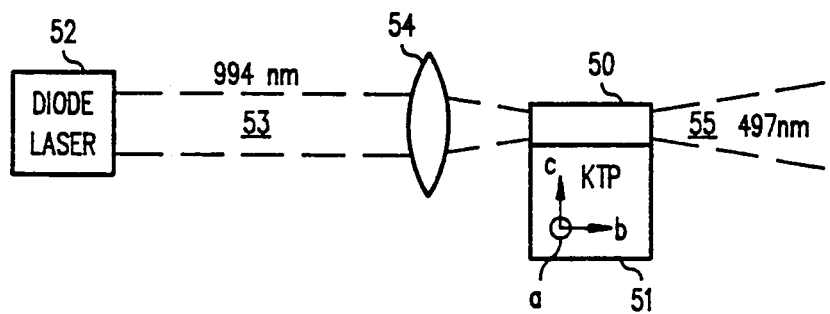
FIG. 4 is a schematic diagram of an apparatus for generating blue-green light using an optical waveguide according to a variation of the invention.

If desired, and as illustrated in FIG. 4, an optical waveguide 50 may be applied to an edge of a KTP crystal 51. Crystal 51 is oriented with its b-axis approximately parallel to the direction of light propogation within waveguide 50. A diode laser 52 with collimation optics and output beam 53 provides essentially 994 nm fundamental radiation. Beam 53 may be modulated, i.e., the laser 52 may be turned on and off, for data storage applications. Beam 53 is polarized at 45° to the a- and c-axis of crystal 51. Beam 53 is directed through a focusing lens 54 into the waveguide to enhance the SHG efficiency in producing a beam 55 of coherent blue-green-light radiation at essentially 497 nm. Note that with this embodiment, no resonator and no locking of laser frequency to resonator frequency is needed. For fabrication of the waveguide it is preferred to have the c-axis perpendicular to the waveguide layer. For a more detailed discussion of fabricating optical waveguides see "Fabrication and Characterization of Optical Waveguides in KTi:OPO$_4$, "Applied Physics Letter, Vol. 50, No. 18, p. 1216, (May 4, 1987) by Bierlein, et al.

It should also be noted that, according to a feature of the invention, the matching of the laser and resonator frequencies is achieved by tuning the frequency of the diode laser source to that of a passive resonator by fine adjustment of the laser injection current. This is in contrast to the prior art method wherein the resonator frequency is tuned to that of the laser source by applying fields to the resonator.

Figure 5:
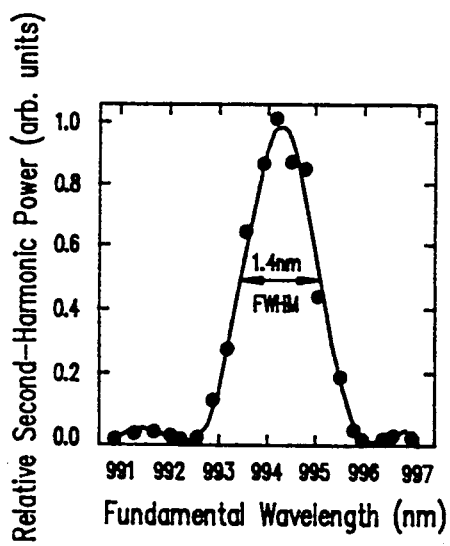
FIG. 5 is a graph of relative second harmonic power versus fundamental wavelength for the present invention.

FIG. 5 shows a graph of fundamental wavelength versus relative second harmonic power output for a single pass of light (i.e., no resonator) through a KTP crystal. The present invention utilizes a strained-layer InGaAs/GaAs semiconductor laser which is able to produce light at approximately 994 nm wavelength. This input light produces the maximum second harmonic generation output from the KTP crystal. The full width at half the maximum (FWHM), i.e. the distance across the peak at half its maximum height, is equal to 1.4 nm.

Figure 6:
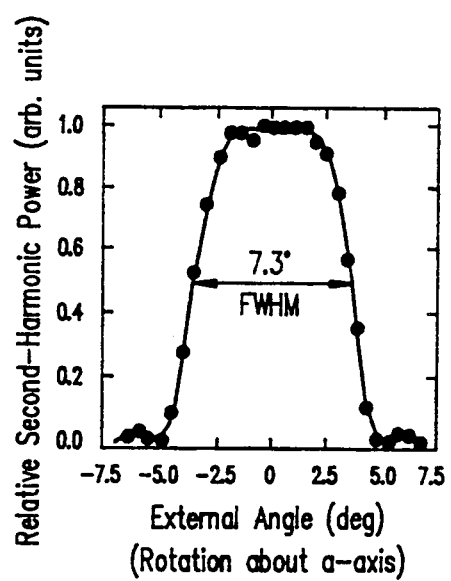
FIG. 6 is a graph of external angle about the a-axis versus relative second harmonic power for the present invention.
Figure 7:
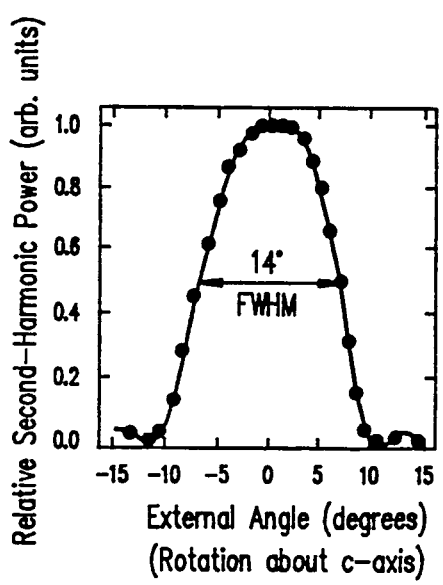
FIG. 7 is a graph of external angle about the c-axis versus relative second harmonic power for the present invention.

FIG. 6 and 7 show graphs of the external angle about the a and c-axis, respectively, versus the relative second harmonic power output for a single pass of light through a KTP crystal. The FWHM for the a-axis is 7.3 degrees and the FWHM for the c-axis is 14 degrees. These are relatively large ranges and allow for large tolerances in aligning the laser and crystal of the present invention.

Figure 8:
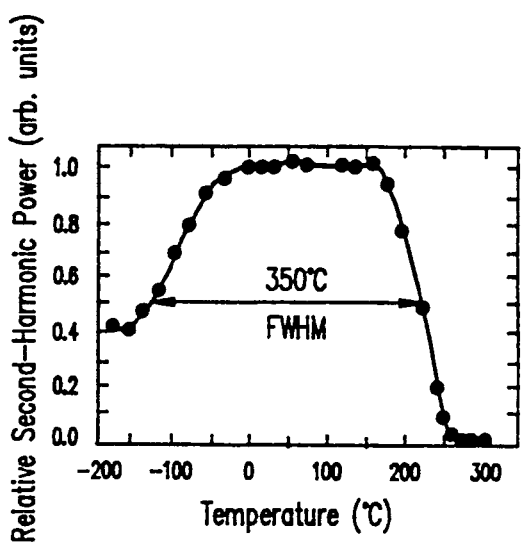
FIG. 8 is a graph of temperature versus relative second harmonic power for the present invention.

FIG. 8 shows a graph of temperature versus relative second harmonic power output for a single pass of light through a KTP crystal. The FWHM is 350° C. This extremely large temperature range is a very important benefit of the present invention. Applications such as data storage systems require that the equipment be able to operate under a large variety of climatic conditions.

It can be seen that the present invention's unique combination of strained-layer InGaAs/GaAs semiconductor laser with a KTP crystal of the proper orientation results in a very efficient generation of blue-green light radiation. The optimal output of the KTP crystal is achieved, yet the operating and fabrication tolerances are broad.

Figure 9:
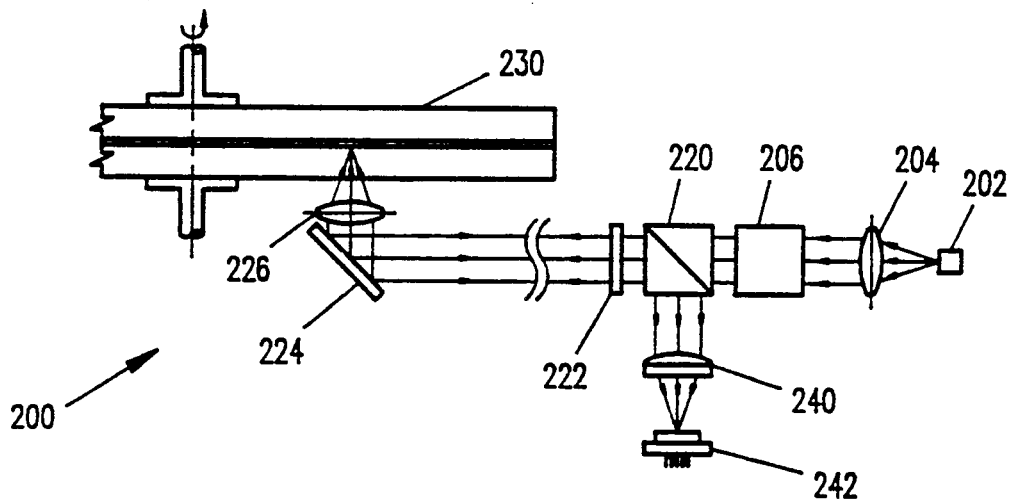
FIG. 9 is a schematic diagram of a data storage system of the present invention.

FIG. 9 shows a phase change optical data storage system 200 which uses a laser system 202. The laser systems of FIGS. 1-4 may be used for system 202. The light from system 202 is collimated by a lens 204 and passes through to a circularizing optical element 206. Element 206 emits light having a circular cross-sectional beam pattern. Element 206 may be a prism.

The light then passes through a polarizing beam splitter 210 and a quarter-wave plate 222. The light is then reflected off of a mirror 224 and focused by a lens 226 onto an optical recording medium 230. Medium 230 may be a phase change type of optical recording medium.

The light reflected from media 230 returns through lens 226, is reflected off of mirror 224, passes through plate 222 to beam splitter 220. Reflected light is then diverted by beam splitter 220 to an astigmatic lens 240. Lens 240 focuses the reflected light onto an optical detector 242. The recorded spots of medium 230 have different reflectivities and these differences are detected by optical detector 242 as data ones and zeros.

Figure 10:
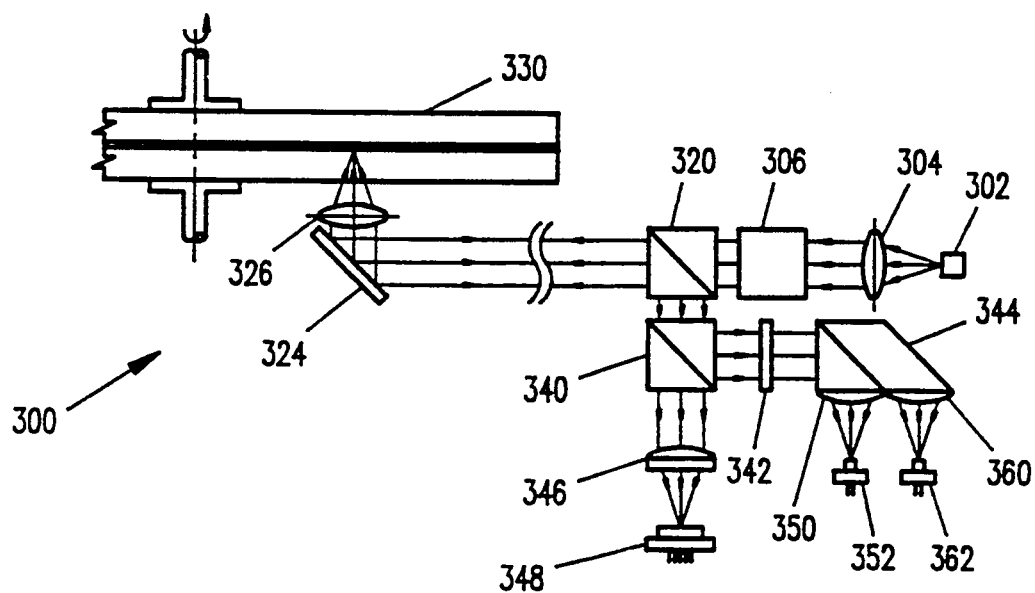
FIG. 10 is a schematic diagram of another embodiment of a data storage system of the present invention.

FIG. 10 shows a magneto-optic data storage system 300 which uses a laser system 302. The laser systems of FIGS. 1-4 may be used for system 302. The light from system 302 is collimated by a lens 304 and passes to a circularizing optical element 306. Element 306 emits light having a circular cross-sectional beam pattern. Element 306 may be a prism.

The light then passes through a leaky polarizing beam splitter 320. Beam splitter 320 has reflectivities of $R_p > 0$ and $R_s$ approximately equal to 1 (s and p represent the orthogonal polarization components of the light). The light is then reflected off of a mirror 324 to a lens 326 and is focused onto an optical recording medium 330. Medium 330 may be a magneto-optic type of optical recording medium.

The light reflected from medium 330 returns through lens 326, reflects off mirror 324, and enters beam splitter 320. Beam splitter 320 diverts the reflected light to an amplitude beam splitter 340. Reflected light is diverted to a half wave-plate 342 and to a beam splitter 344. Light of other amplitude passes through beam splitter 340. This light is focused by an astigmatic lens 346 to a quad detector 348 to produce tracking and focus signals.

The medium 330 has recorded spots having either an up or down magnetic domain. The light reflected off of these spots has their plane of polarization rotated one way or the other depending upon the direction of the magnetic domain of the spot. Beam splitter 344 separates the reflected light depending upon which way the plane of polarization has been rotated. The separated beams go to a lens 350 and an optical detector 352 or to a lens 360 and an optical detector 362. The difference in output signals of detectors 352 and 362 are the data ones and zeros. A more detailed explanation of optical disk drive systems is given in "Gradiant-Index Optics and Miniature Optics," SPIE, Vol. 935, p. 63, (1988), by Glenn T. Sincerbox.

While the invention has been shown and described with respect to preferred embodiments thereof especially suitable for use in optical storage applications, the invention also is highly desirable for use in printers and color displays. Also, it will be understood by those skilled in the art that changes in form and detail may be made in these embodiments without departing from the scope and teaching of the invention. Accordingly, the apparatus and method herein disclosed are to be considered merely as illustrative, and the invention is to be limited only as specified in the claims.

What is claimed is:

1. A laser system comprising:
   a light generation means for producing an essentially 980–1,000 nm wavelength fundamental radiation having a first and second orthogonal polarization component;
   a non-linear crystal of essentially KTP receiving said fundamental radiation and for producing second harmonic radiation, the crystal is oriented with its b-axis approximately parallel to the direction of propagation of said fundamental radiation and with its a- and c-axis approximately parallel to said first and second polarization components, respectively, the system being tolerant of variations in fundamental radiation wavelength, crystal orientation and operating temperature.

2. The system of claim 1 further comprising:
   a resonator in which the crystal is located for increasing the power of said second harmonic radiation.

3. The system of claim 1, wherein the light generation means is a semiconductor diode laser.

4. The system of claim 3, wherein the diode laser is a strained layer InGaAs/GaAs diode laser.

5. The system of claim 1, wherein the fundamental radiation has a wavelength of approximately 994 nm and said second harmonic radiation has a wavelength of approximately 497 nm.

6. The system of claim 2, wherein the resonator is resonant at the frequency of said fundamental radiation.

7. The system of claim 2, further including laser control means connected to the laser for adjusting the frequency of said fundamental radiation to that of the resonant frequency of the resonator.

8. The system of claim 2, wherein the resonator comprises a pair of reflectors located on opposite sides of the crystal.

9. The system of claim 2, wherein the resonator is resonant at the frequency of said second harmonic radiation.

10. The system of claim 2, further including laser control means connected to the laser for adjusting the frequency of the second harmonic radiation to the resonant frequency of the resonator.

11. The system of claim 1, wherein the non-linear crystal comprises an optical waveguide.

12. A laser system comprising:
    a first diode laser for producing a first beam of fundamental radiation of essentially 980–1,000 nm wavelength which is polarized in a first direction;
    a second diode laser for producing a second beam of fundamental radiation of essentially 980–1,000 nm wavelength which is polarized in a second direction, said second direction is approximately orthogonal to said first direction;
    a non-linear crystal of essentially KTP for receiving said first and second beams and for producing second harmonic radiation, the crystal is oriented with its b-axis approximately parallel to the direction of propagation of said fundamental radiation, and with its a- and c-axis approximately parallel to said first and second directions of polarization, respectively, the system being tolerant of variations in fundamental radiation wavelength, crystal orientation and operating temperature; and
    a resonator in which the crystal is located for increasing the power of said second harmonic radiation.

13. The system of claim 12, wherein the first and second diode lasers are strained layer InGaAs/GaAs diode lasers.

14. The system of claim 12, wherein said fundamental radiation has a wavelength of approximately 994 nm and said second harmonic radiation has a wavelength of approximately 497 nm.

15. The system of claim 12, wherein the frequencies of the first and second beams are within the second harmonic phase matching bandwidth of each other.

16. The system of claim 12, wherein the resonator comprises a pair of reflectors located on opposite sides of the crystal.

17. The system of claim 12, further including:
    a first laser control means connected to the first diode laser for controlling the frequency of said first beam; and
    a second laser control means connected to the second diode laser for controlling the frequency of said second beam.

18. A laser system comprising:
    a diode laser for producing an essentially 980–1,000 nm wavelength fundamental radiation beam which is polarized in a first direction;
    an non-linear crystal of essentially KTP for receiving said fundamental radiation and producing second harmonic radiation, the crystal is oriented with its b-axis approximately parallel to the direction of propagation of said fundamental frequency radiation, and with its a- and c-axis at approximately 45 degrees to said first direction of polarization, the system being tolerant of variations in fundamental radiation wavelength, crystal orientation and operating temperature; and
    a resonator in which the crystal is located for increasing the power of said second harmonic radiation, the resonator is resonant at the frequency of second harmonic radiation.

19. The system of claim 18, wherein said diode laser is a strained layer InGaAs/GaAs diode laser.

20. The system of claim 18, wherein said fundamental radiation has a wavelength of approximately 994 nm and said second harmonic radiation has a wavelength of approximately 497 nm.

21. The system of claim 18, wherein the resonator comprises a pair of reflectors located on opposite sides of the crystal.

22. The system of claim 18, further including: a laser control means connected to the diode laser for controlling the frequency of said fundamental radiation.

23. A laser system comprising:
    a diode laser for producing an essentially 980–1,000 nm wavelength fundamental radiation beam which is polarized in a first direction;
    a non-linear crystal of essentially KTP for receiving said fundamental radiation and producing second harmonic radiation, the crystal is oriented with its b-axis approximately parallel to the direction of propagation of said fundamental frequency radiation, and with its a- and c-axis at approximately 45 degrees to said first direction of polarization, the system being tolerant of variations in fundamental radiation wavelength, crystal orientation and operating temperature;

a resonator in which the crystal is located for increasing the power of said second harmonic radiation; and a phase plate located within the resonator.

24. The system of claim 23, wherein said diode laser is a strained layer InGaAs/GaAs diode laser.

25. The system of claim 23, wherein said fundamental radiation has a wavelength of approximately 994 nm and said second harmonic radiation has a wavelength of approximately 497 nm.

26. The system of claim 23, wherein the resonator comprises a pair of reflectors located on opposite sides of the crystal.

27. The system of claim 23, further including:

a laser control means connected to the diode laser for controlling the frequency of said fundamental radiation.

28. A laser system comprising:

a diode laser for producing an essentially 980–1,000 nm wavelength fundamental radiation which is polarized in a first direction; and an optical waveguide formed on a non-linear crystal of essentially KTP for receiving said fundamental frequency radiation and for producing second harmonic radiation, the crystal is oriented with its b-axis approximately parallel to the direction of propagation of said fundamental radiation in the waveguide and with its a- and c-axis at approximately 45 degrees to said first direction of polarization, the system being tolerant of variations in fundamental radiation wavelength, crystal orientation and operating temperature.

29. The system of claim 28, wherein the fundamental radiation has a wavelength of approximately 997 nm and said second harmonic radiation has a wavelength of approximately of 497 nm.

30. A method for producing coherent blue-green light radiation having a wavelength of essentially 490–500 nm wavelength comprising the steps of:

generating an essentially 980–1,000 nm wavelength fundamental radiation having a first and a second orthogonal polarization component with a diode laser; and transmitting said fundamental radiation through a non-linear crystal of essentially KTP in a direction approximately parallel to the b-axis of the crystal and with the first and second polarization components approximately parallel to the a- and c-axis respectively, of the crystal, the system being tolerant of variations in fundamental radiation wavelength, crystal orientation and operating temperature.

31. A data storage system comprising:

a laser for producing an essentially 980–1,000 nm wavelength fundamental radiation having a first and a second orthogonal polarization component;

a non-linear crystal of essentially KTP for receiving said fundamental radiation and for producing second harmonic radiation, the crystal is oriented with its b-axis approximately parallel to the direction of propagation of said fundamental radiation and with its a- and c-axis approximately parallel to said first and second polarization components, respectively, the system being tolerant of variations in fundamental radiation wavelength, crystal orientation and operating temperature;

an optical recording medium;

an optical transmission means for directing said second harmonic radiation from the crystal to the optical recording medium; and optical reception means for receiving a reflected second harmonic radiation from the optical recording medium and for providing a data signal responsive thereto.

32. A data storage system comprising:

a laser for producing an essentially 980–1,000 nm wavelength fundamental radiation having a first and second orthogonal polarization components;

an optical waveguide formed in a non-linear crystal of essentially KTP for receiving said fundamental radiation and for producing second harmonic radiation, the crystal is oriented with its b-axis approximately parallel to the direction of propagation of said fundamental radiation in the waveguide and with its a- and c-axis approximately parallel to said first and second polarization components, respectively, the system being tolerant of variations in fundamental radiation wavelength, crystal orientation and operating temperature;

an optical recording medium;

and optical transmission means for directing said second harmonic radiation from the waveguide to the optical recording medium; and optical reception means for receiving a reflected second harmonic radiation beam from the optical recording medium and for providing a data signal responsive thereto.

* * * * *